United States Patent
Tuominen et al.

(10) Patent No.: US 10,700,035 B2
(45) Date of Patent: Jun. 30, 2020

(54) STACKED ELECTRONICS PACKAGE AND METHOD OF MANUFACTURING THEREOF

(71) Applicant: General Electric Company, Schenectady, NY (US)

(72) Inventors: Risto Ilkka Tuominen, Tokyo (JP); Arun Virupaksha Gowda, Rexford, NY (US)

(73) Assignee: General Electric Company, Schenectady, NY (US)

( * ) Notice: Subject to any disclaimer, the term of this patent is extended or adjusted under 35 U.S.C. 154(b) by 157 days.

(21) Appl. No.: 15/343,261

(22) Filed: Nov. 4, 2016

(65) Prior Publication Data

US 2018/0130762 A1 May 10, 2018

(51) Int. Cl.
*H01L 23/00* (2006.01)
*H01L 23/538* (2006.01)
(Continued)

(52) U.S. Cl.
CPC .......... *H01L 24/24* (2013.01); *H01L 23/5384* (2013.01); *H01L 24/19* (2013.01); *H01L 24/82* (2013.01); *H01L 25/0657* (2013.01); *H01L 25/074* (2013.01); *H01L 25/16* (2013.01); *H01L 25/18* (2013.01); *H01L 25/50* (2013.01);
(Continued)

(58) Field of Classification Search
CPC ..... H01L 24/24; H01L 24/19; H01L 23/5386; H01L 23/5389; H01L 25/18; H01L 25/50; H01L 2224/2402; H01L 2224/24105; H01L 2224/24147; H01L 2224/24996;
(Continued)

(56) References Cited

U.S. PATENT DOCUMENTS 5,874,770 A 2/1999 Saia et al.
7,791,897 B2 9/2010 Das et al.
(Continued)

FOREIGN PATENT DOCUMENTS

JP 2015177163 A 10/2015
WO 0067538 A1 11/2000

OTHER PUBLICATIONS

Park et al., "Dielectric Composite Material with Good Performance and Process Ability for Embedding of Active and Passive Components into PCBs," Electronic Components and Technology Conference (ECTC), 2013 IEEE 63rd, pp. 1325-1331, Las Vegas, NV.
(Continued)

*Primary Examiner* — Tong-Ho Kim
(74) *Attorney, Agent, or Firm* — Ziolkowski Patent Solutions Group, SC

(57) ABSTRACT

An electronics package includes an insulating substrate, a first electrical component coupled to a bottom surface of the insulating substrate, and a first conductor layer formed adjacent the bottom surface of the insulating substrate. The electronics package also includes a second conductor layer formed on a top surface of the insulating substrate and extending through a plurality of vias in the insulating substrate to electrically couple with the first electrical component and the first conductor layer. A second electrical component is electrically coupled to the first conductor layer and the first electrical component and the second electrical component are positioned in a stacked arrangement.

32 Claims, 10 Drawing Sheets

(51) Int. Cl.
*H01L 25/18* (2006.01)
*H01L 25/00* (2006.01)
*H01L 25/065* (2006.01)
*H01L 25/07* (2006.01)
*H01L 25/16* (2006.01)
*H01L 23/498* (2006.01)

(52) U.S. Cl.
CPC .... *H01L 23/49816* (2013.01); *H01L 23/5386* (2013.01); *H01L 23/5389* (2013.01); *H01L 2224/04105* (2013.01); *H01L 2224/12105* (2013.01); *H01L 2224/16235* (2013.01); *H01L 2224/16238* (2013.01); *H01L 2224/2402* (2013.01); *H01L 2224/24105* (2013.01); *H01L 2224/24145* (2013.01); *H01L 2224/24147* (2013.01); *H01L 2224/24996* (2013.01); *H01L 2224/2541* (2013.01); *H01L 2224/25171* (2013.01); *H01L 2224/25174* (2013.01); *H01L 2224/32225* (2013.01); *H01L 2224/32245* (2013.01); *H01L 2224/73253* (2013.01); *H01L 2224/73267* (2013.01); *H01L 2224/92144* (2013.01); *H01L 2924/15311* (2013.01); *H01L 2924/15313* (2013.01)

(58) Field of Classification Search
CPC . H01L 2224/25171; H01L 2224/25174; H01L 2224/2541
USPC .......................................................... 257/737
See application file for complete search history.

(56) References Cited

U.S. PATENT DOCUMENTS

| | | | |
|---|---|---|---|
| 8,049,338 B2 | 11/2011 | Delgado et al. | |
| 8,114,712 B1 | 2/2012 | McConnelee et al. | |
| 8,368,201 B2 | 2/2013 | Tuominen | |
| 8,466,007 B2 | 6/2013 | Delgado et al. | |
| 8,716,870 B2 | 5/2014 | Gowda | |
| 8,778,738 B1 | 7/2014 | Lin et al. | |
| 8,987,876 B2 | 3/2015 | Gowda et al. | |
| 9,177,957 B1 | 11/2015 | Lee et al. | |
| 9,209,151 B2 | 12/2015 | Chauhan et al. | |
| 2002/0173134 A1 | 11/2002 | Viswanadam et al. | |
| 2007/0155057 A1 | 7/2007 | Wang | |
| 2007/0235810 A1* | 10/2007 | Delgado | H01L 23/5389 257/356 |
| 2008/0136002 A1* | 6/2008 | Yang | H01L 24/82 257/686 |
| 2008/0296056 A1* | 12/2008 | Kinoshita | H01L 23/13 174/261 |
| 2008/0318027 A1 | 12/2008 | Woychik et al. | |
| 2009/0039510 A1 | 2/2009 | Jobetto | |
| 2009/0072379 A1* | 3/2009 | Ewe | H01L 21/4821 257/700 |
| 2010/0052129 A1 | 3/2010 | Iihola et al. | |
| 2010/0059854 A1 | 3/2010 | Lin et al. | |
| 2011/0068461 A1 | 3/2011 | England | |
| 2012/0018876 A1 | 1/2012 | Wu et al. | |
| 2012/0112345 A1 | 5/2012 | Blackwell et al. | |
| 2013/0075924 A1 | 3/2013 | Lin et al. | |
| 2013/0093097 A1 | 4/2013 | Yu et al. | |
| 2014/0264799 A1* | 9/2014 | Gowda | H01L 23/3677 257/675 |
| 2015/0083469 A1* | 3/2015 | Sunohara | H01L 23/481 174/255 |
| 2015/0084207 A1 | 3/2015 | Chauhan et al. | |
| 2015/0115458 A1 | 4/2015 | Palm | |
| 2015/0179616 A1 | 6/2015 | Lin et al. | |
| 2015/0244313 A1 | 8/2015 | McNamara et al. | |
| 2015/0255420 A1 | 9/2015 | Saito | |
| 2015/0380356 A1 | 12/2015 | Chauhan et al. | |
| 2016/0056136 A1 | 2/2016 | McConnelee et al. | |
| 2016/0148887 A1 | 5/2016 | Yu et al. | |
| 2016/0172344 A1 | 6/2016 | We et al. | |
| 2017/0033090 A1 | 2/2017 | Hsieh et al. | |
| 2017/0053896 A1* | 2/2017 | Yu | H01L 21/76877 |
| 2017/0207160 A1 | 7/2017 | Gowda et al. | |

OTHER PUBLICATIONS

Braun et al., "Through Mold Vias for Stacking of Mold Embedded Packages," Electronic Components and Technology Conference (ECTC), 2011 IEEE 61st, pp. 48-54, May 31, 2011-Jun. 3, 2011, Lake Buena Vista, FL.

* cited by examiner

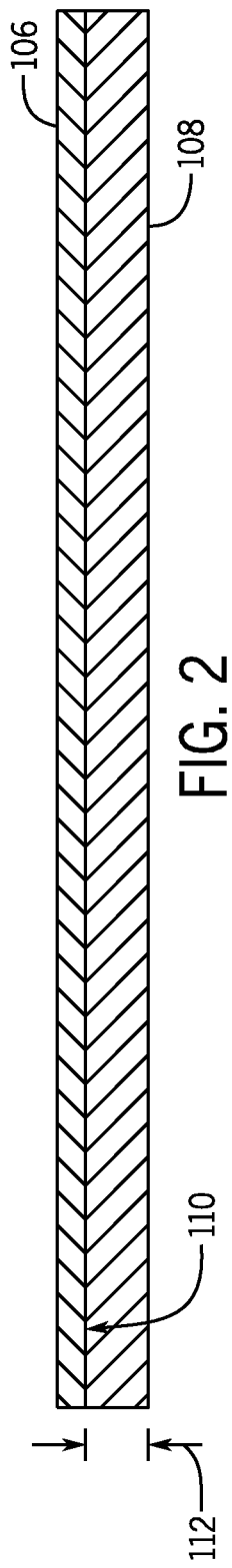
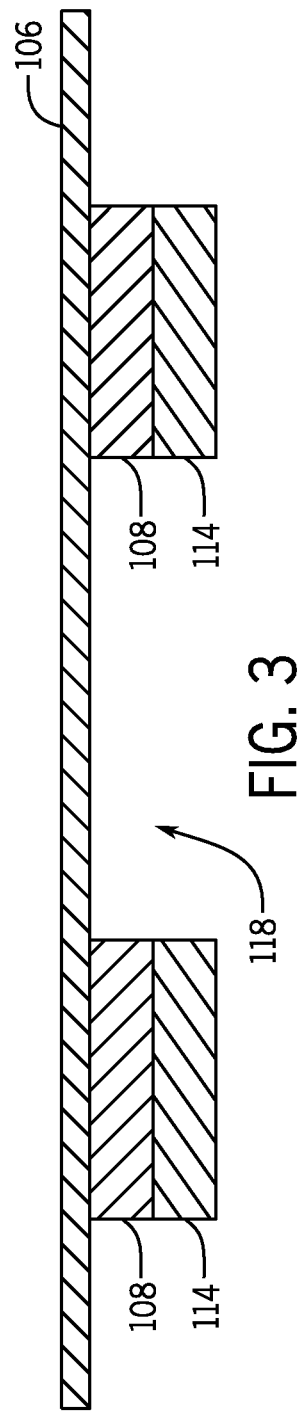
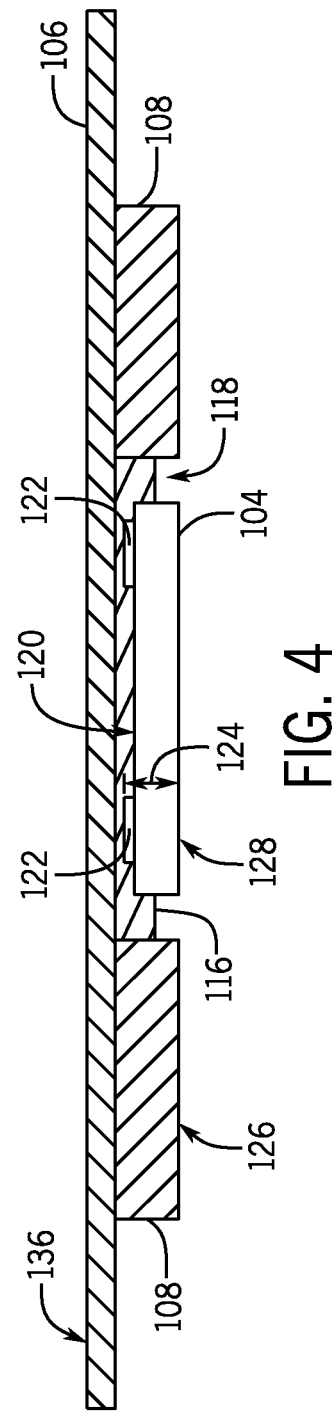

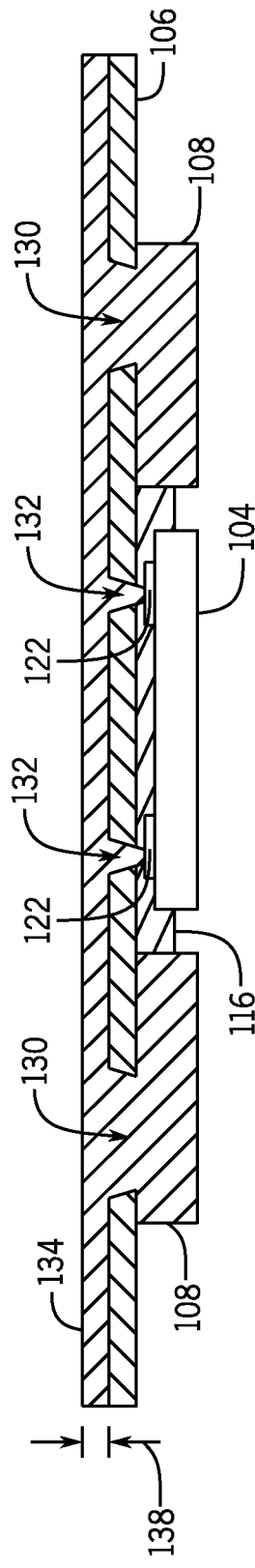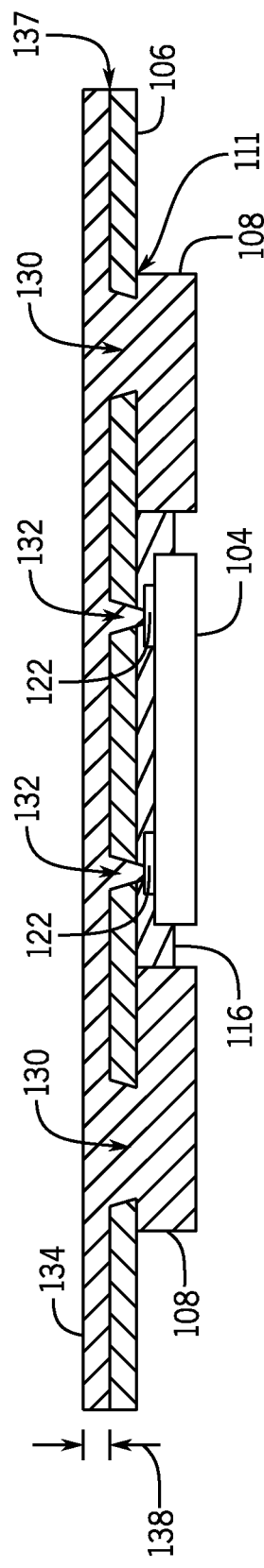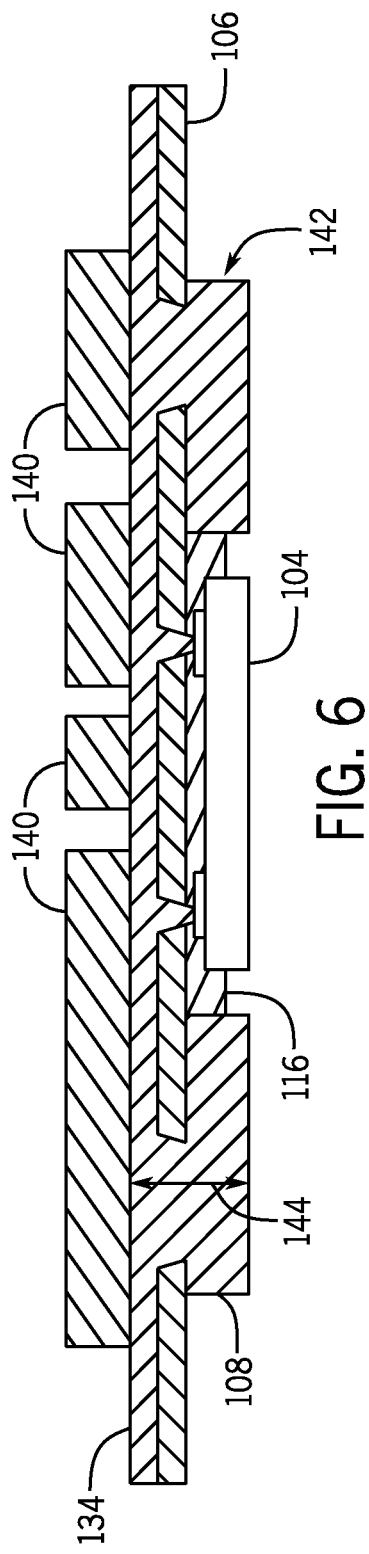

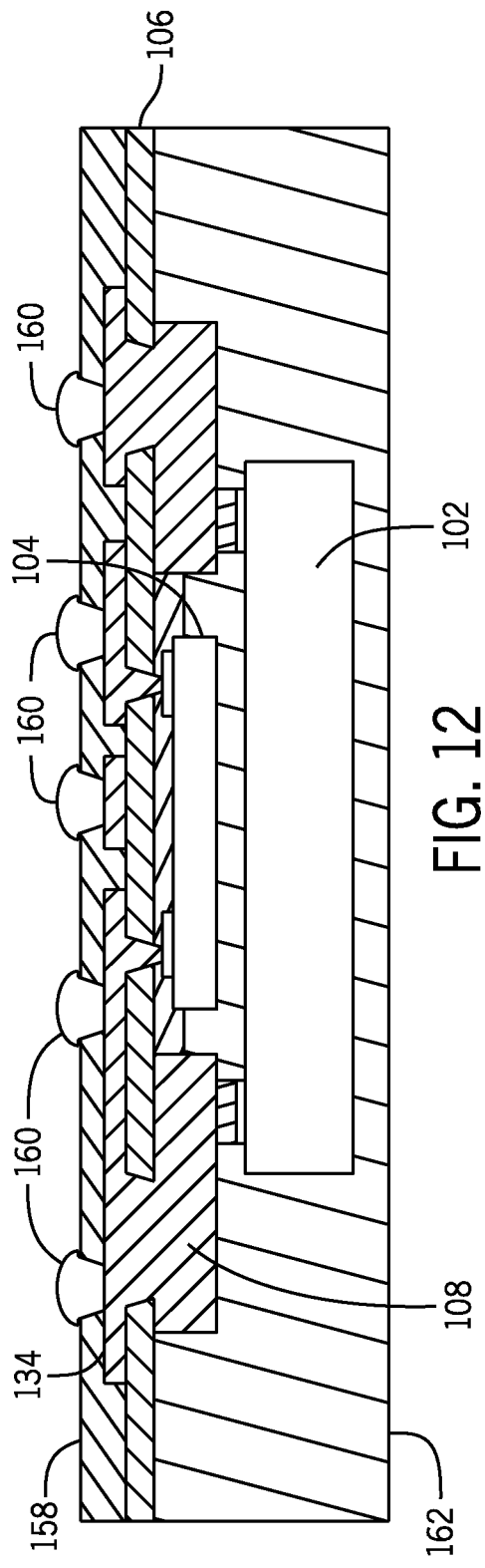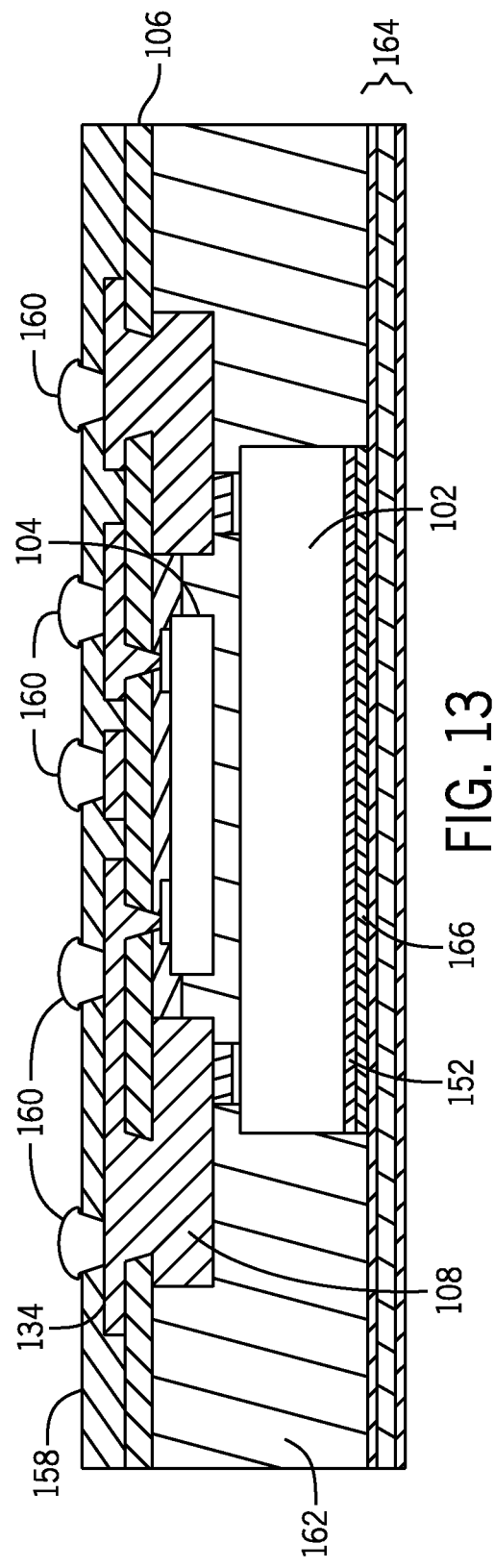

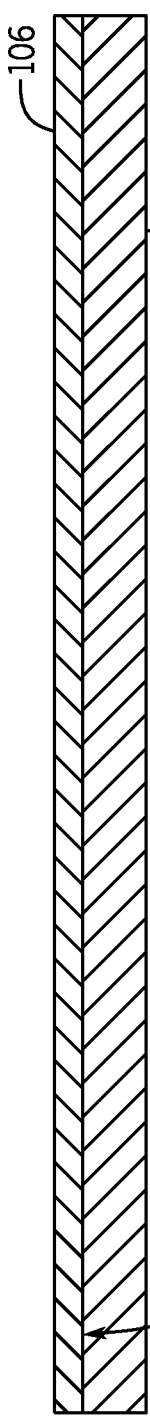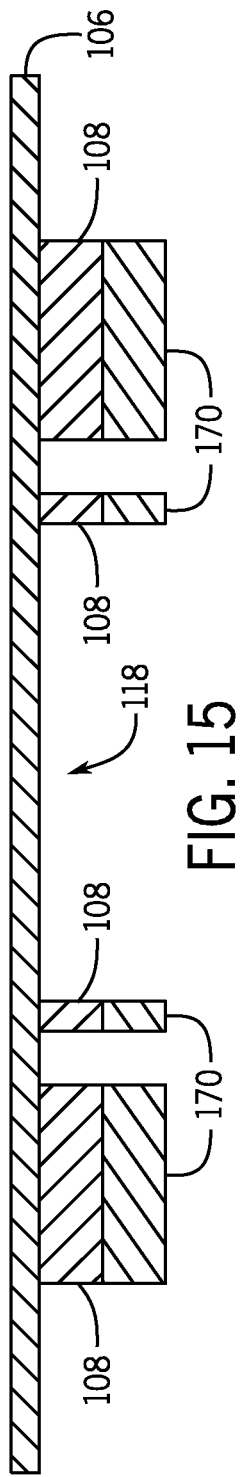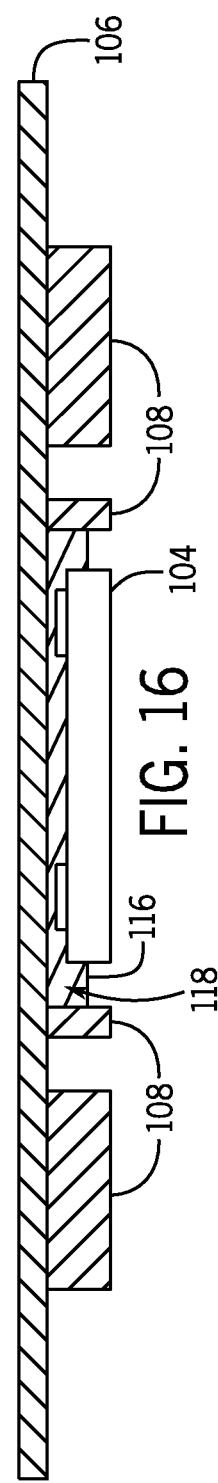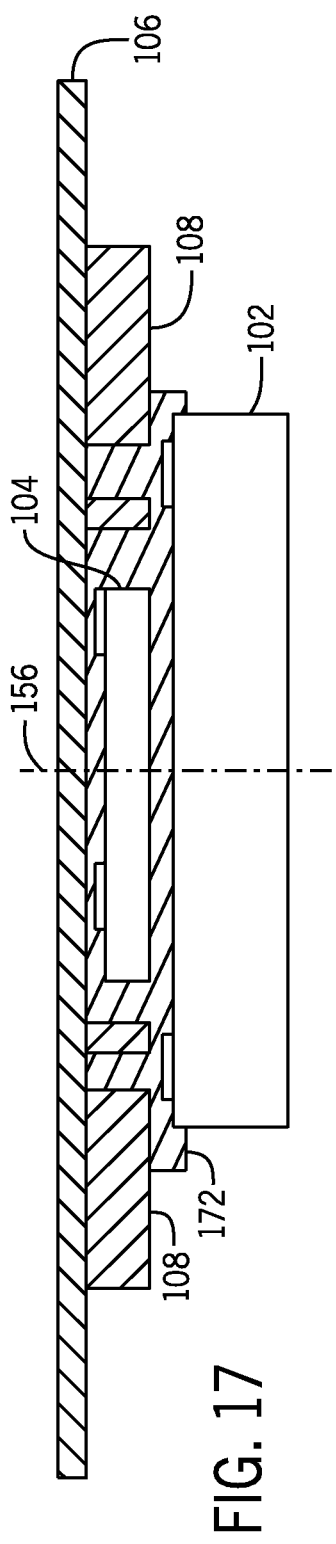

STACKED ELECTRONICS PACKAGE AND METHOD OF MANUFACTURING THEREOF

BACKGROUND OF THE INVENTION

Embodiments of the invention relate generally to semiconductor device packages or electronics packages and, more particularly, to an electronics package that includes a plurality of electronics devices arranged in a stacked configuration. In some embodiments, the stacked electronics devices are provided in combination with a conductor with locally varied thicknesses. This multi-thickness conductor includes a combination of regions having high current carrying capabilities and high density routing capabilities and facilitates the integration of different types of electronics devices in a miniaturized package topology.

As semiconductor device packages have become increasingly smaller and yield better operating performance, packaging technology has correspondingly evolved from leaded packaging, to laminated-based ball grid array (BGA) packaging, to chip scale packaging (CSP), then flipchip packages, and now buried die/embedded chip build-up packaging. Advancements in semiconductor chip packaging technology are driven by ever-increasing needs for achieving better performance, greater miniaturization, and higher reliability.

A challenge to existing manufacturing techniques is the miniaturization of electronics packages that incorporate different types of individually packaged semiconductor dies that have different current carrying and routing density requirements, such as a mixture digital semiconductor devices and power semiconductor devices. The general structure of a prior art electronics package 10 incorporating a number of individually packaged components 12, 14, 16, 18 is shown in FIG. 1. The individually packaged components 12, 14, 16, 18 are mounted on a multi-layer printed circuit board (PCB) 20 that has a thickness 22 of approximately 31 to 93 mils. The individually packaged components 12, 14, 16, 18 may be power semiconductor packages, packaged controllers, or other discrete electrical components such as inductors or passive components that are coupled to electrical contacts 24 of PCB 20 using metalized connections 26 such as, for example, solder balls in the form of a ball grid array (BGA).

In the illustrated example, individually packaged devices 14, 16 each include a respective semiconductor device or die 28, 30 having contact pads 32 formed on an active surface thereof. Die 28, 30 are provided on a mounting platform 34, 36 and encased within an insulating material 38, 40. Wirebonds 42, 44 form direct metal connections between active surfaces of respective die 28, 30 and a metalized input/output (I/O) provided on or coupled to the lower surface of die 28, 30. In the case of discrete component 14, wirebonds 42 form an electrical connection between contact pads 32 of die 28 to I/O pads 46 provided on a bottom surface of discrete component 14. Wirebond 42 electrically couples contact pads 32 to I/O leads 48. Where die 30 is a diode, for example, wirebond 42 may connect to the anode on a first surface of the die 30 and a second surface of the die 30 may be soldered to the leadframe. I/O pads 46 and I/O leads 48 are coupled to electrical contacts 24 of PCB 20 by way of metalized connections 26. The overall thickness 50 of such prior art IC packages may be in the range of 500 μm-2000 μm or larger.

Alternatively, electrical connections between components may be realized using a combination of thick and thin conductor layers that are electrically connected to the appropriate semiconductor dies or power devices using through hole or via technology. However, inclusion of multiple routing layers adds considerable thickness to the overall electronics package, a factor that in combination with the complex conductor structure, limits product level miniaturization, design flexibility, and cost efficiency. Additionally, both of the aforementioned techniques include multiple routing layers, which results in a long and complex conductor structure between electrical components and weakens the electrical performance of the overall package, which is increasingly unfavorable in high performance packaging (e.g., high frequency, RF, intelligent power, and other advanced electronics packaging).

Accordingly, it would be desirable to provide a new electronics packaging technology that permits electrical components of different types to be integrated into a highly miniaturized electronics package with locally enhanced electrical and thermal conductivity for certain electronics components and increased routing density in regions proximate other electronics components. It would further be desirable for such a packaging technology to permit a shorter conductor length between electrical components and improve signal fidelity.

BRIEF DESCRIPTION OF THE INVENTION

In accordance with one aspect of the invention, an electronics package includes an insulating substrate, a first electrical component coupled to a bottom surface of the insulating substrate, and a first conductor layer formed adjacent the bottom surface of the insulating substrate. The electronics package also includes a second conductor layer formed on a top surface of the insulating substrate and extending through a plurality of vias in the insulating substrate to electrically couple with the first electrical component and the first conductor layer. A second electrical component is electrically coupled to the first conductor layer and the first electrical component and the second electrical component are positioned in a stacked arrangement.

In accordance with another aspect of the invention, a method of manufacturing an electronics package includes forming a first conductor layer on a bottom surface of an insulating substrate, coupling a first electrical component to the bottom surface of the insulating substrate adjacent the first conductor layer, and coupling a second electrical component to a bottom surface of the first conductor layer in a stacked arrangement with respect to the first electrical component. The method also includes forming a second conductor layer on a top surface of the insulating substrate, the second conductor layer extending through vias in the insulating substrate to electrically couple with the first electrical component and the first conductor layer.

In accordance with yet another aspect of the invention, an electronics package includes a pair of electrical components coupled to an insulating substrate, a first conductor layer formed on a first surface of the insulating substrate, and a second conductor layer formed on a second surface of the insulating substrate. A portion of the first conductor layer and one of the electrical components is positioned between the other electrical component and the insulating substrate. One of the electrical components is positioned within an opening formed between adjacent portions of the first conductor layer.

In accordance with yet another aspect of the invention, an electronics package includes a first conductor layer, a first electrical component coupled to a bottom surface of a first insulating substrate and positioned between adjacent portions of the first conductor layer, and a second conductor layer coupled to a top surface of the first insulating substrate and extending through at least one via in the first insulating substrate to electrically couple with at least one contact pad of the first electrical component. The electronics packages also includes a second electrical component coupled to a bottom surface of a second insulating substrate. The first conductor layer extends through at least one via in the second insulating substrate to electrically couple with at least one contact pad of the second electrical component.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 2-7 are schematic cross-sectional side views of an electronics package during various stages of a manufacturing/build-up process, according to an embodiment of the invention.

FIG. 12 is a schematic cross-sectional side view of the electronics package of FIG. 7 including an insulating material surrounding the electrical components, according to another embodiment of the invention.

FIG. 13 is a schematic cross-sectional side view of an electronics package including a direct bond copper (DBC) substrate, according to another embodiment of the invention.

FIGS. 14-20 are schematic cross-sectional side views of an electronics package during various stages of a manufacturing/build-up process, according to another embodiment of the invention.

DETAILED DESCRIPTION

Figure 1:
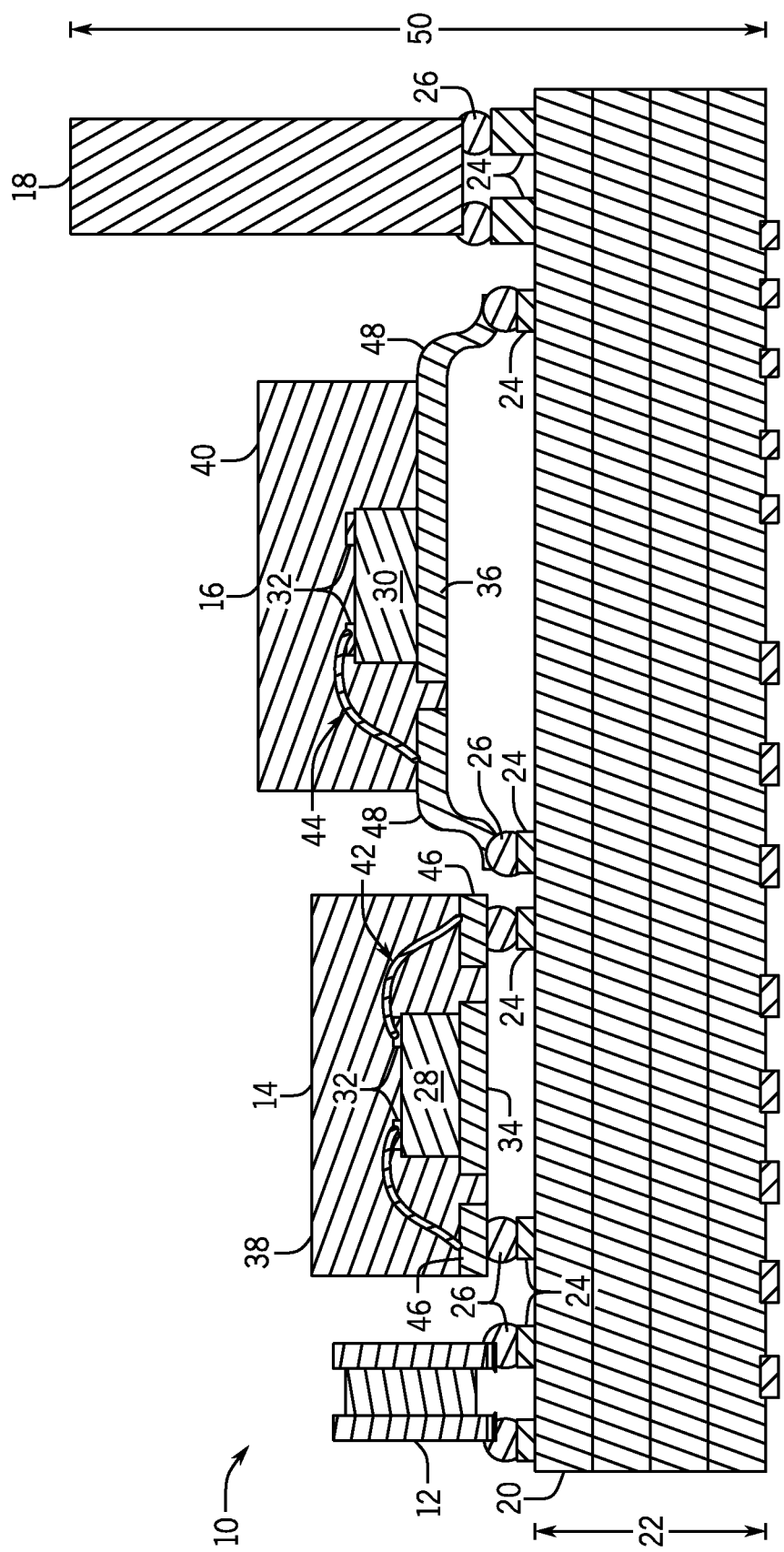
FIG. 1 is a schematic cross-sectional side view of a prior art electronics package incorporating a mixture of different types of semiconductor devices.

Embodiments of the present invention provide for an electronics package that includes multiple semiconductor devices, dies, or chips coupled to a patterned conductor layer in a stacked arrangement. In some embodiments, the patterned conductor layer is formed on opposing surfaces of an insulating substrate, extends through the insulating substrate, and includes regions with locally varying thicknesses and differing routing density and current carrying capabilities. As described in more detail below, portions of the multi-thickness conductor layer include a low density routing pattern that provides the requisite current carrying capabilities for one type of electrical component, such as a power semiconductor die, while other, thinner portions of the conductor layer have a high density routing pattern that enables routing capability below 100/100 µm L/S for another type of electrical component, such as a digital semiconductor die. The multi-thickness conductor layer is configured to permit a pair of die to be positioned in a stacked arrangement, resulting in a miniaturized package configuration.

As used herein, the phrase "power semiconductor device" refers to a semiconductor component, device, die or chip designed to carry a large amount of current and/or support a large voltage. Power semiconductor devices are typically used as electrically controllable switches or rectifiers in power electronic circuits, such as switched mode power supplies, for example. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). In use, power semiconductor devices are typically mounted to an external circuit by way of a packaging structure, with the packaging structure providing an electrical connection to the external circuit and also providing a way to remove the heat generated by the devices and protect the devices from the external environment. Typical power semiconductor devices include two (2) to four (4) input/output (I/O) interconnections to electrically connect both sides of a respective power semiconductor device to an external circuit.

As used herein, the phrase "digital semiconductor device" refers to a semiconductor component, device, die, or chip provided in the form of a digital logic device, such as a microprocessor, microcontroller, memory device, video processor, or an Application Specific Integrated Circuit (ASIC), as non limiting examples. As is understood in the art, digital semiconductor devices have reduced current carrying requirements and require increased routing density as compared to power semiconductor devices due to the differences in interconnection pitch and number of I/Os between the device types. A digital semiconductor device may include anywhere between ten and thousands of I/Os depending on the device configuration.

While the electrical components embedded in the electronics package are referenced below in the embodiments of FIGS. 2-26 specifically as one or more power semiconductor devices in combination with one or more digital semiconductor devices, it is understood that other combinations of differently configured electrical components could be substituted in the electronics package, and thus embodiments of the invention are not limited only to the embedding of power devices and digital devices in a common electronics package. That is, the techniques of stacking electrical components and using locally varied planar conductor thicknesses may be extended to electronics packages with any combination of electrical components having differing current carrying capabilities and routing density structures. Thus, the electronics package embodiments described below should also be understood to encompass electronics packages including resistors, capacitors, inductors, filters, or other similar devices, provided either alone or in combination with one or more power or digital devices. Additionally, while the embodiments of FIGS. 2-26 are described as including one power device and one digital device, it is contemplated that the concepts described herein may be extended to electronics packages that include any combination of three or more electrical components.

Referring now to FIGS. 2-7, cross-sectional views showing the various build up steps of a technique for manufacturing an electronics package 100 are illustrated according to an embodiment of the invention. A cross-section of the build-up process for a singular electronics package 100 is shown in FIGS. 2-7 for ease of visualization of the build-up process. However, one skilled in the art will recognize that multiple electronics packages could be manufactured in a similar manner at the panel level and then singulated into individual electronics packages as desired. As described in detail below, electronics package 100 is a multi-chip package that includes a combination of different semiconductor devices or die 102, 104. In the illustrated embodiment described herein, die 102 is a power semiconductor device and die 104 is a digital semiconductor device. However, electronics package 100 may include any combination of electrical components requiring different current carrying and routing density capabilities in alternative embodiments.

Referring first to FIG. 2, the manufacturing technique begins by plating an insulating substrate 106 with a first conductor layer 108 or metallization layer. According to various embodiments, insulating substrate 106 may be provided in the form of an insulating film or dielectric substrate, such as for example a Kapton® laminate flex, although other suitable materials may also be employed, such as Ultem®, polytetrafluoroethylene (PTFE), or another polymer film, such as a liquid crystal polymer (LCP) or a polyimide substrate, as non-limiting examples. First conductor layer 108 is an electrically conductive metal such as, for example, copper. However, other electrically conducting materials or a combination of metal and a filling agent may be used in other embodiments. First conductor layer 108 may be applied directly to the bottom surface 110 of insulating substrate 106 using a sputtering and electroplating technique or other electroless method of metal deposition. Alternatively, a titanium adhesion layer and copper seed layer 111 (FIG. 5A) may first be applied to the bottom surface 110 of insulating substrate 106 using a sputtering process, followed by an electroplating process that increases a thickness 112 of the first conductor layer 108 to a desired level. In the embodiments described herein, thickness 112 may be in the range of 25 μm-250 μm. However, it is contemplated that first conductor layer 108 may be formed having a thickness outside this range of values in alternative embodiments. In yet another embodiment, the manufacturing technique may begin by providing a metal-clad insulating film.

Next a first layer photoresist mask 114, shown in FIG. 3, is formed on first conductor layer 108 and is patterned with openings for a high current, I/O routing layer. With the first layer photoresist mask 114 in place, first conductor layer 108 is subsequently patterned using an etching process to create a first conductor pattern in the form of a low density L/S pattern appropriate for forming electrical connections to power semiconductor device 102. After the first layer photoresist mask 114 is removed, one or multiple organic or inorganic coating layers (not shown), such as organic solderability preservative (OSP) or Ni/Au, may be applied to the surface of first conductor layer 108.

A layer of insulating material 116 is used to affix a digital semiconductor device 104 to insulating substrate 106, as shown in FIG. 4. As used herein the phrase "insulating material" refers to an electrically insulating material that adheres to surrounding components of the electronics package such as a polymeric material (e.g., epoxy, liquid crystal polymer, ceramic or metal filled polymers) or other organic material as non-limiting examples. In some embodiments, insulating material 116 may be provided in either an uncured or partial cured (i.e., B-stage) form. In the illustrated embodiment, insulating material 116 is limited to a select portion of bottom surface 110 of insulating substrate 106, however, insulating material 116 may be applied to coat the entirety of bottom surface 110 and all or portions of exposed surfaces of patterned first conductor layer 108 in alternative embodiments. Insulating material 116 may be applied using a coating technique such as spin coating or slot die coating, using a lamination or spray process, or may be applied by a programmable dispensing tool in the form of an inkjet printing-type device technique, as non-limiting examples. Alternatively, insulating material 116 may be applied to digital semiconductor device 104 prior to placement on first conductor layer 108.

Digital semiconductor device 104 is positioned into insulating material 116 using conventional pick and place equipment and methods. As shown, digital semiconductor device 104 is received within an opening 118 formed between adjacent portions of first conductor layer 108. Digital semiconductor device 104 is positioned with respect to insulating substrate 106 such that a top surface or active surface 120 comprising electrical contact pads 122, contact elements or connection pads is positioned into insulating material 116. Contact pads 122 provide conductive routes (I/O connections) to internal contacts within digital semiconductor device 104 and may have a composition that includes a variety of electrically conductive materials such as aluminum, copper, gold, silver, nickel, or combinations thereof as non-limiting examples. As understood in the art, the number of contact pads 122 on digital semiconductor device 104 is dependent upon the complexity and intended functionality of device 104. The pad pitch (i.e., the center-to-center distance between adjacent contact pads) is inversely proportional to the number of contact pads 122 provided on digital semiconductor device 104. While not shown in the illustrated embodiment, it is contemplated that other discrete or passive devices, such as, for example, a resistor, a capacitor, or an inductor, may be affixed to insulating substrate 106 by way of insulating material 116 alone or in combination with one or more semiconductor devices.

After digital semiconductor device 104 is positioned, insulating material 116 is fully cured, thermally or by way of a combination of heat or radiation. Suitable radiation may include UV light and/or microwaves. In one embodiment, a partial vacuum and/or above atmospheric pressure may be used to promote the removal of volatiles from the insulating material 116 during cure if any are present. The thickness 112 of first conductor layer 108 is greater than or substantially equal to the thickness 124 of digital semiconductor device 104. Thus, the bottom surface 126 of first conductor layer 108 is either substantially coplanar with or extends below the bottom surface 128 of digital semiconductor device 104. In other words, first conductor layer 108 is formed to be coplanar with a portion of the digital semiconductor device 104.

Referring now to FIG. 5, a plurality of vias 130, 132 are formed through insulating substrate 106 and insulating material 116. As shown, vias 130 are aligned with remaining portions of first conductor layer 108 and vias 132 are formed to expose contact pads 122 of digital semiconductor device 104. Vias 130, 132 may be formed by a UV laser drilling or dry etching, photo-definition, or mechanical drilling process as non-limiting examples. Alternately, vias 130, 132 may be formed by way of other methods including: plasma etching, dry and wet etching, or other laser techniques like CO2 and excimer. In one embodiment, vias 130, 132 are formed having angled side surfaces, as shown in FIG. 5, to facilitate later filling and metal deposition. Vias 130, 132 are subsequently cleaned such as through a reactive ion etching (RIE) desoot process or laser process.

While the formation of vias 130, 132 through insulating substrate 106 and insulating material 116 is shown in FIG. 5 as being performed after placement of digital semiconductor device 104 into insulating material 116, it is recognized that the placement of semiconductor device 104 could occur after via formation. Furthermore, a combination of pre- and post-drilled vias could be employed.

A second conductor layer 134 or metallization layer is then plated on the top surface 136 of insulating substrate 106. Similar to first conductor layer 108, second conductor layer 134 is an electrically conducting material and may be applied using any of the techniques described above with respect to first conductor layer 108. Optionally, a titanium adhesion layer and copper seed layer 137 (FIG. 5A) may first be applied via a sputtering process to the top surface 136 of insulating substrate 106 prior to applying second conductor layer 134.

As shown, second conductor layer 134 extends through vias 132 and electrically couples with contact pads 122 of digital semiconductor device 104. In the illustrated embodiment, second conductor layer 134 has a thickness 138 less than the thickness 112 of first conductor layer 108. The reduced thickness 138 of second conductor layer 134 permits the portion of second conductor layer 134 electrically coupled to digital semiconductor device 104 to be formed having a routing pattern with a high density routing capability. As used herein, the phrase "high density routing capability" or "high density L/S pattern" refers to a routing capability below 100/100 µm L/S (line/space). In an exemplary embodiment, thickness 138 is in the range of approximately 4 µm-30 µm. However, one skilled in the art will recognize that the thickness 138 of second conductor layer 134 may be varied to correspond to the interconnection pitch of a particular digital semiconductor die 104. In alternative embodiments, second conductor layer 134 may be formed with a thickness equal to or less than thickness 112 of first conductor layer 108.

Figure 7:
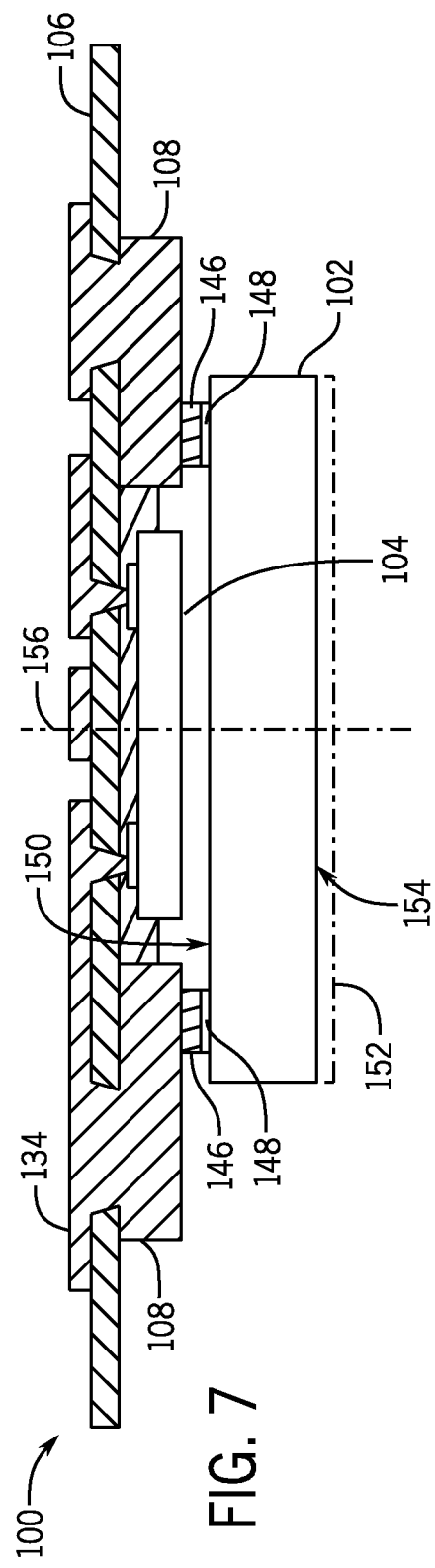

A second layer photoresist mask 140, shown in FIG. 6, is formed on second conductor layer 134 and patterned with openings that define a routing layer electrically connected to contact pads 122 of digital semiconductor device 104 and first conductor layer 108. With the second layer photoresist mask 140 in place, second conductor layer 134 is patterned using an etching process. As shown in FIG. 7, the process yields a patterned second conductor layer 134 with openings for a high density L/S pattern that extends out from contact pads 122 of digital semiconductor device 104, through vias 132, and out across the top surface 136 of insulating substrate 106. In an alternative embodiment, one or both of the first and second conductor layers 108, 134 are formed from a photodefinable polymer using a semi-additive process.

Together, the first conductor layer 108 and second conductor layer 134 create a multi-thickness conductor 142 that extends through insulating substrate 106 and has high density routing capabilities for digital semiconductor device 104 and high current carrying capabilities for power semiconductor device 102. Multi-thickness conductor 142 has an overall thickness 144 equal to the combined thicknesses 114, 132 of the first conductor layer 108 and second conductor layer 128 plus the thickness 141 of the insulating substrate 106.

After any remaining portions of second layer photoresist mask 140 are removed, a joining material 146 is used to mechanically and electrically couple power semiconductor device 102 to first conductor layer 108. According to various embodiments, joining material 146 may be solder, sintered silver, a conductive insulating material such as a polymer filled with an electrically conductive filler such as silver, or another electrically conductive material able to withstand high temperatures. In one embodiment, a liquid phase bonding joining technique is used to couple power semiconductor device 102 to first conductor layer 108. In some embodiments, the void between power semiconductor device 102 and digital semiconductor device 104 is filled with an insulating material as described in more detail with respect to FIG. 12.

As shown in FIG. 7, joining material 146 is electrically coupled to contact pads 148 or connection pads located on a top surface or active surface 150 of power semiconductor device 102. Similar to contact pads 122 of digital semiconductor device 104, contact pads 148 provide conductive routes (I/O connections) to internal contacts within power semiconductor device 102 and are formed of an electrically conductive material. In the case where power semiconductor device 102 is an IGBT, for example, contact pads 148 are coupled to corresponding emitter and/or gate or anode regions of the power semiconductor device 102. Depending on the device configuration, power semiconductor device 102 may also include at least one lower collector pad or contact pad 152 (shown in phantom) that is disposed on its backside or lower surface 154.

In the fabrication technique described above, power semiconductor device 102 is affixed to first conductor layer 108 as a final step of the fabrication technique. Doing so beneficially permits multi-thickness conductor 142 to be tested prior to attaching the costly power semiconductor device 102. In alternative embodiments, power semiconductor device 102 may be affixed at any time after forming first conductor layer 108 and positioning digital semiconductor device 104.

Figure 8:
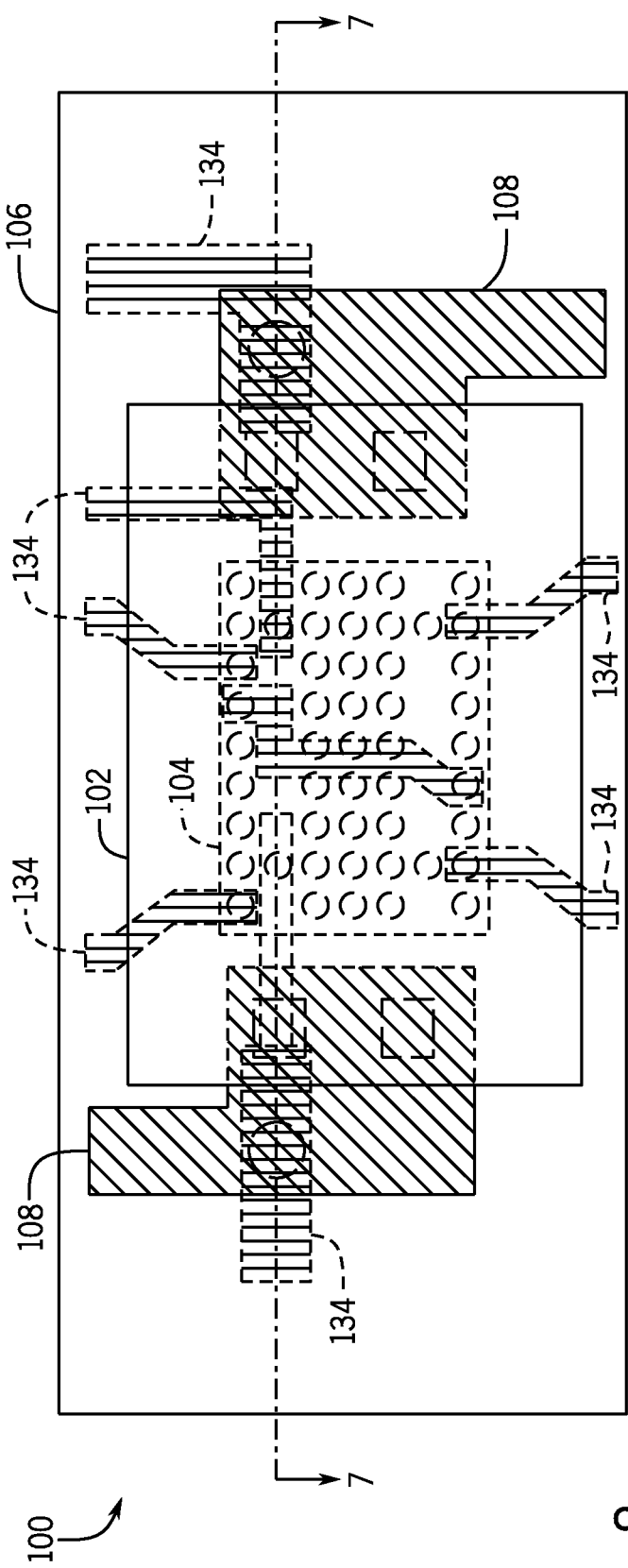
FIG. 8 is a bottom view of the electronics package of FIG. 7.

The relative thicknesses 112, 124 of first conductor layer 108 and power semiconductor device 102 beneficially permit digital semiconductor device 104 and power semiconductor device 102 to be arranged with respect to one another in a stacked configuration, as shown in FIGS. 7 and 8, with the digital semiconductor device 104 positioned between the power semiconductor device 102 and insulating substrate 106. When stacked the contact pads 122 of digital semiconductor device 104 and the contact pads 148 of digital semiconductor device 104 face a common direction.

In the embodiment shown in FIGS. 7 and 8, power semiconductor device 102 and digital semiconductor device 104 are stacked symmetrically, with the center of power semiconductor device 102 and the center of digital semiconductor device 104 aligned along a common vertical axis 156. As digital semiconductor device 104 is smaller in overall size than power semiconductor device 102, this symmetrically stacked arrangement results in digital semiconductor device 104 being positioned wholly on top of power semiconductor device 102.

Figure 9:
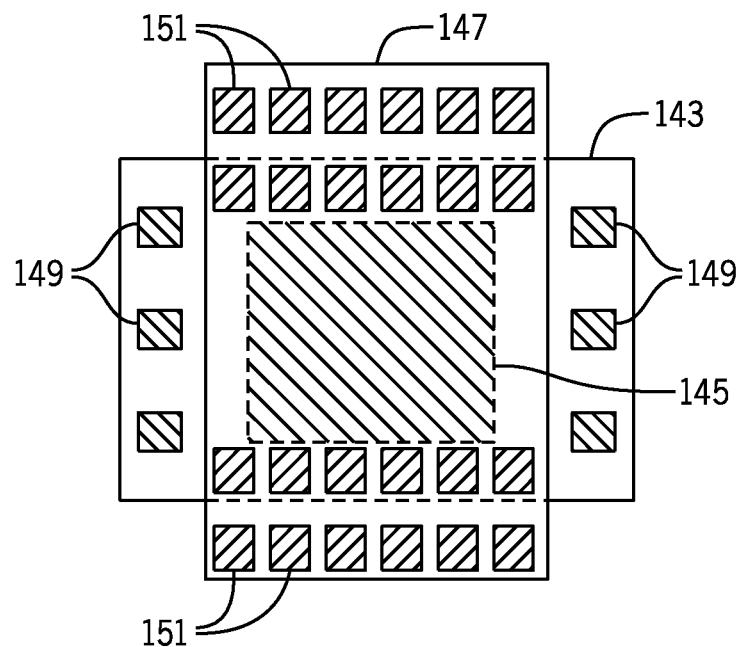
FIGS. 9-11 illustrate layout configurations of two stacked electronics components as viewed from the top side of an electronics package, according to alternative embodiments of the invention.
Figure 10:
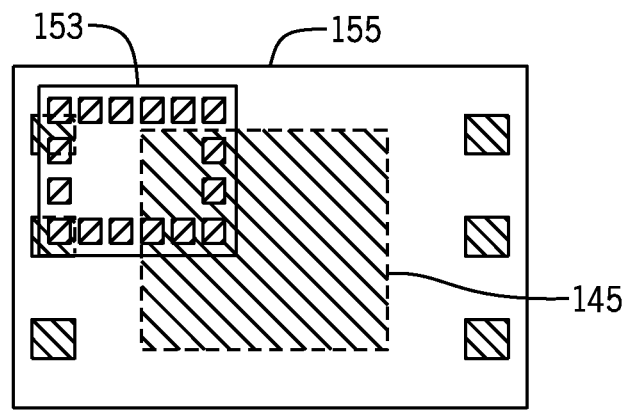
Figure 11:
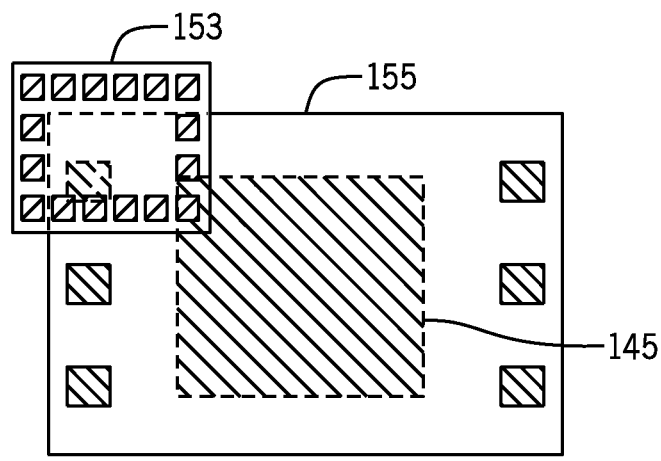

Alternative stacked arrangements of digital semiconductor device 104 and power semiconductor device 102 are shown in FIGS. 9-11. These stacked configurations are to be understood as depicting non-limiting examples of alternative configurations of stacked electronics components that may be integrated into an electronics package such as that shown in FIG. 7. For purposes of clarity, all other components of the electronics package have been omitted.

In the embodiment of FIG. 9, a power semiconductor device 143 having a backside contact pad 145 and a digital semiconductor device 147 are stacked in a symmetrical arrangement in the y-axis or thickness direction of the package but rotated with respect to one another such that a portion of power semiconductor device 143 extends beyond two side edges of digital semiconductor device 147 and a portion of the digital semiconductor device 147 extends beyond two side edges of power semiconductor device 143 to facilitate formation of conductive I/O connection to respective contact pads 149, 151 of devices 143, 147.

Alternatively, a digital semiconductor device 153 and a power semiconductor device 155 may be horizontally offset from one another within electronics package 100 in an asymmetrical stacked arrangement. In such embodiments, digital semiconductor device 153 may either be stacked wholly above the power semiconductor device 155, as shown in FIG. 10, or partially above power semiconductor device 155 such that a portion thereof extends beyond the outer perimeter of the power semiconductor device 155, as shown in FIG. 11. In embodiments that include three or more electrical components, additional electronics components may be positioned adjacent digital semiconductor device 153 in either a partially or a wholly stacked arrangement.

Referring to FIGS. 12 and 13, a solder mask layer 158 may be applied over the second conductor layer 134 of electronics package 100 to provide a protective coating and define interconnect pads. Interconnect pads may have a metal finish, such as Ni or Ni/Au, to aid solderability. A series of input/output (I/O) connections 160 are then made to provide a route for electrical connections between the power semiconductor device 102, digital semiconductor device 104, and external components (not shown) such as, for example a busbar or printed circuit board (PCB). Such I/O connections 160 may be provided in the form of plated bumps or pillar bumps, as non-limiting examples.

In some embodiments, power semiconductor device 102 and digital semiconductor device 104 are overcoated with a layer of electrically insulating material 162 to provide rigidity and ease of handling and to prevent arcing between semiconductor devices and other metal components in high voltage applications. Such a configuration is shown in FIG. 12 and is applicable in embodiments where the power semiconductor device 102 is a lateral device that does not include a connection to the backside of the device 102. As shown, electrically insulating material 162 may also be applied to fill the region between power semiconductor device 102 and digital semiconductor device 104.

In embodiments where power semiconductor device 102 includes one or more lower contact pad 152, a conductive substrate 164 may be provided to create an electrical connection to lower contact pad 152 as shown in FIG. 13. Conductive substrate 164 may be an encapsulated metal lead frame or a multi-layer substrate such as, for example, a printed circuit board (PCB) or DBC substrate as shown in the illustrated embodiment that includes a non-organic ceramic substrate with upper and lower sheets of copper bonded to both sides thereof with a direct bond copper interface or braze layer. The electrical connection between conductive substrate 164 and power semiconductor die 102 is made through a conductive joining layer 166, such as solder, silver paste, or a conductive adhesive as examples, which is formed on lower contact pad 152. In such an embodiment, the connection between conductive substrate 164 and the lower contact pad 152 of power semiconductor device 102 is made prior to filling the volume between the conductive substrate 164 and the insulating substrate 106 with electrically insulating material 162.

In the embodiment described with respect to FIGS. 2-8, the first conductor layer 108 is patterned to form a low density L/S routing pattern that provides requisite current carrying capabilities for the power semiconductor device 102 coupled thereto. In an alternative embodiment, the first conductor layer 108 may be patterned to form conductive studs that may be used for backside attachment of device 102 and to electrically couple contact pads of one component 102 to the contact pads of the other component 104. In such an embodiment, components 102, 104 may be the same or different types of electrical components or semiconductor devices. As one non-limiting example, component 102 may be provided as a low power electrical component such as, for example a memory device, and component 104 may be provided as another low power electrical component such as, for example, a digital I/O device.

An alternative technique for manufacturing a stacked electronics package 168 is illustrated in FIGS. 14-20. Electronics package 168 includes a number of similar components as electronics package 100, and thus numbers used to indicate components in FIGS. 2-7 will also be used to indicate similar components in FIGS. 14-20.

Similar to the manufacturing technique described with respect to FIG. 2, manufacture of electronics package 168 begins by applying a first conductor layer 108 to the bottom surface 110 of insulating substrate 106, as shown in FIG. 14. Alternatively, fabrication of electronics package 168 may begin with a metal-clad dielectric substrate. A first layer photoresist mask 170 (FIG. 15) is then applied to mask the portion of first conductor layer 108 corresponding to a low density L/S pattern. This low density L/S pattern is formed to include an opening 118 large enough to permit digital semiconductor device 104 to be affixed directly to insulating substrate 106. An etching technique is used to remove portions of the first conductor layer 108 exposed by the first layer photoresist mask 170.

Insulating material 116 (FIG. 16) is next applied and used to affix digital semiconductor device 104 to insulating substrate 106. As shown, digital semiconductor device 104 is positioned within opening 118, between adjacent portions of first conductor layer 108. Another layer of insulating material 172 (FIG. 17) is then applied to affix power semiconductor device 102 to first conductor layer 108 in a stacked arrangement with respect to digital semiconductor device 104. Devices 102, 104 may be symmetrically stacked along a common vertical axis 156 as shown in FIG. 17 or offset from one another horizontally, according to alternative embodiments.

Figure 18:
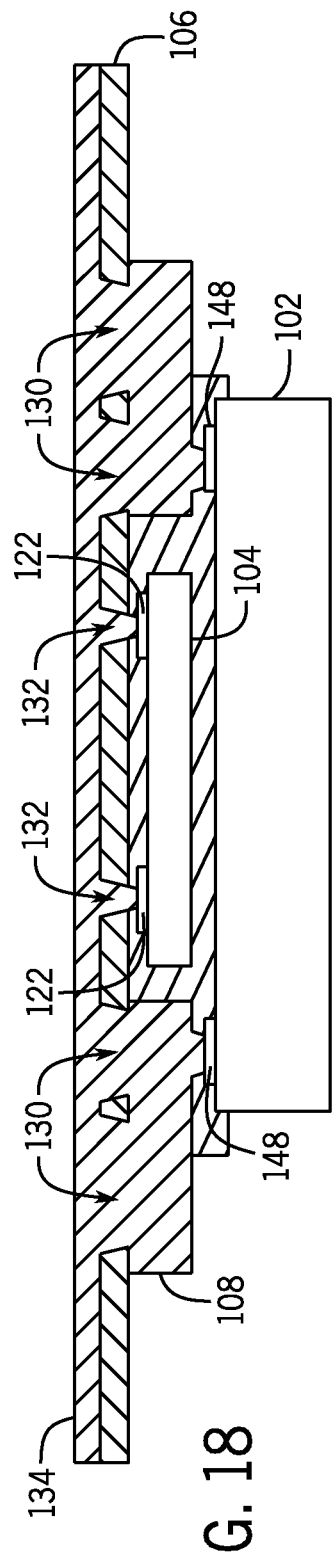

After insulating material 116 and insulating material 172 are cured, a series of vias 130, 132 are formed through insulating substrate 106, first conductor layer 108 and cured insulating material 116, 172, as shown in FIG. 18. Second conductor layer 134 is then formed on the top surface 136 of insulating substrate 106 and extends through vias 130, 132 to electrically connect to contact pads 122, 148 of digital semiconductor device 104 and power semiconductor device 102.

Figure 19:
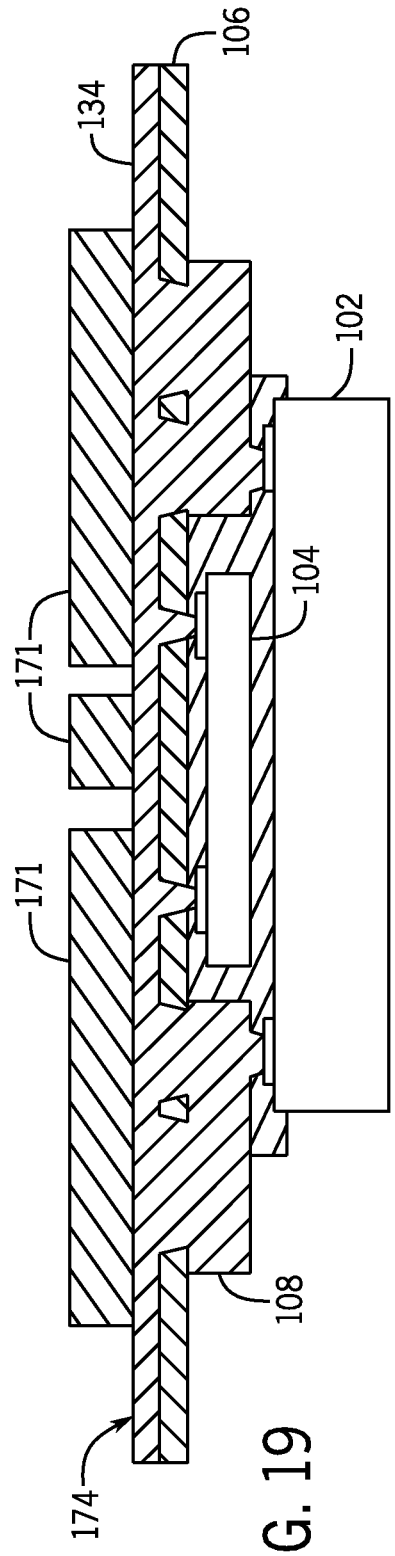
Figure 20:
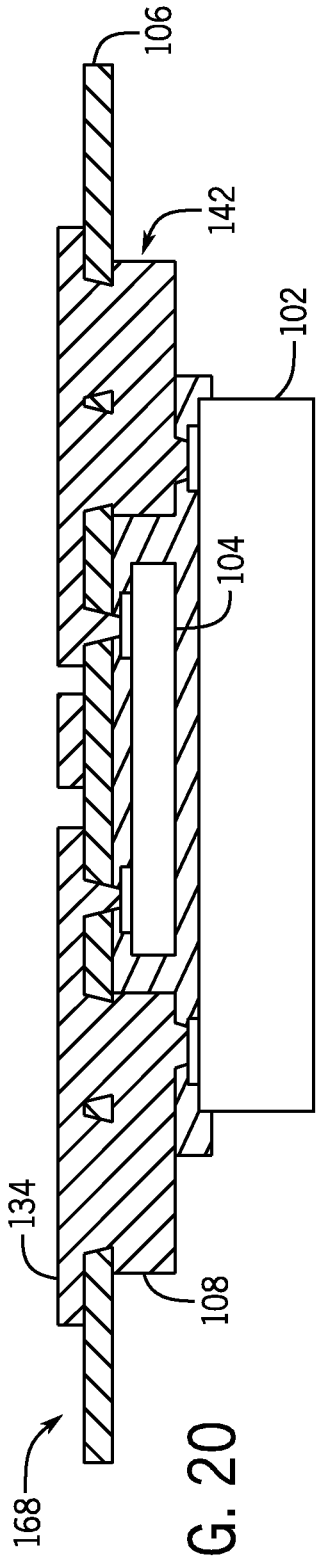

Referring to FIG. 19, a second layer photoresist mask 171 is applied to the top surface 174 of the second conductor layer 134. Select portions of second photoresist mask 171 are removed to define a high density L/S pattern. The exposed portions of second conductor layer 134 are then removed using an etching technique resulting in the formation of the high density L/S pattern, as shown in FIG. 20. After etching process is complete, the remaining portions of second layer photoresist mask 171 are removed using a stripping technique to yield the electronics package 168 shown in FIG. 20. The multi-thickness conductor 142 formed by the combination of first conductor layer 108 and second conductor layer 134 thus includes a high density routing pattern for electrical connections to digital semiconductor device 104 and a low density routing pattern with high current carrying capabilities for power semiconductor device 102.

Yet another technique for manufacturing a stacked electronics package 176 is illustrated in FIGS. 21-26. Components common to electronics package 176 and electronics package 100 (FIG. 7) will be referred to with common numbers in the discussion of FIGS. 21-26.

Figure 21:
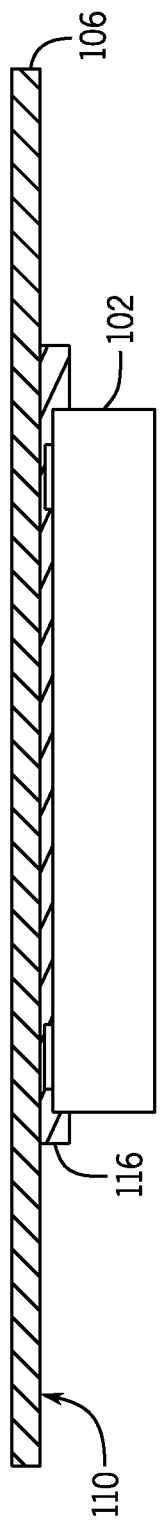
FIGS. 21-26 are schematic cross-sectional side views of an electronics package during various stages of a manufacturing/build-up process, according to yet another embodiment of the invention.
Figure 22:
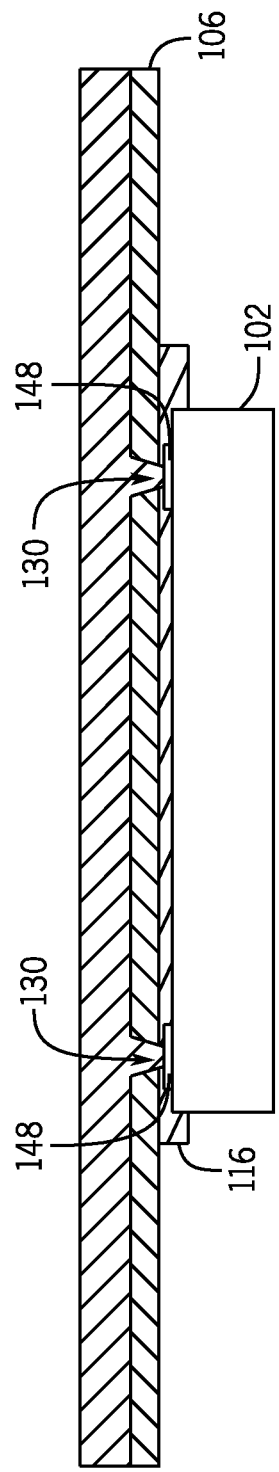

Referring first to FIG. 21, the build-up process for electronics package 176 begins by affixing a power semiconductor device 102 to the bottom surface 110 of insulating substrate 106 with insulating material 116. Insulating material 116 may be applied to coat the entirety of bottom surface 110 or to select portions of the bottom surface 110 as shown. After insulating material 116 is cured, a series of vias 130 are formed through insulating substrate 106 at locations aligned with contact pads 148 of power semiconductor device 102, as shown in FIG. 22. A first conductor layer 108 is then formed on the top surface 136 of insulating substrate 106 and patterned to define a low density L/S pattern in a similar manner as described with respect to the techniques above. Optionally, a titanium adhesion layer and copper seed layer (e.g., layer 111 in FIG. 5A) may first be applied via a sputtering process to the top surface 136 of insulating substrate 106 prior to applying first conductor layer 108.

Figure 23:
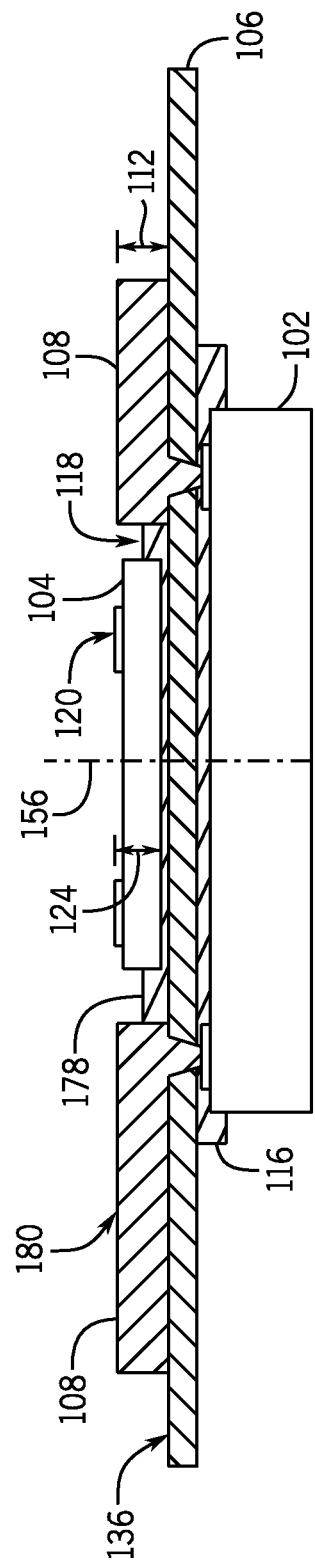

A digital semiconductor device 104 is then affixed to the top surface 136 of insulating substrate 106 with an insulating material 178. As shown in FIG. 23, digital semiconductor device 104 is positioned within an opening 118 formed between adjacent portions of first conductor layer 108. The relative thicknesses 112, 124 of first conductor layer 108 and digital semiconductor device 104 are such that the top surface 180 of first conductor layer 108 and the top or active surface 120 of digital semiconductor device 104 are relatively co-planar. In the embodiment shown, digital semiconductor device 104 and power semiconductor device 102 are aligned along a common vertical axis 156 in a symmetrical configuration. Alternatively, semiconductor device 104 and power semiconductor device 102 may be horizontally offset from one another within the electronics package 176 in an asymmetrical arrangement.

Figure 24:
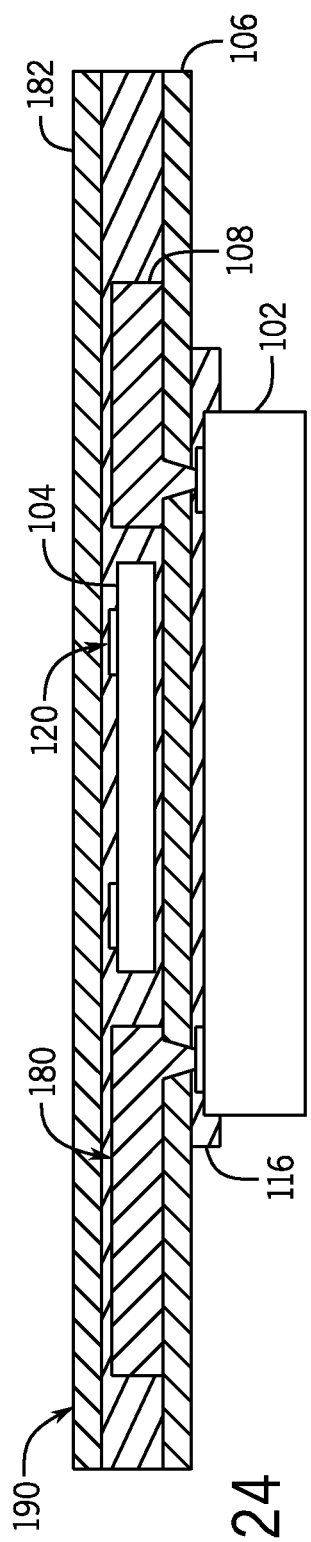
Figure 25:
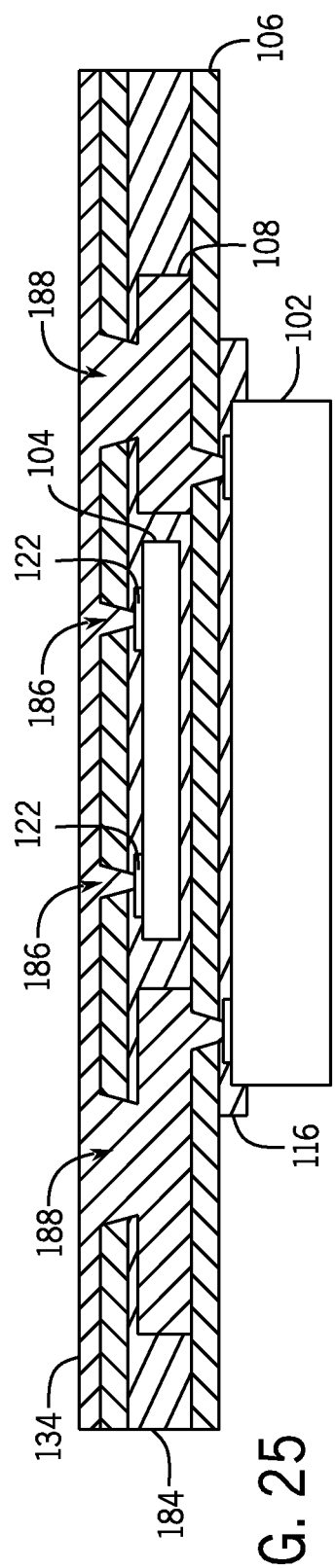
Figure 26:
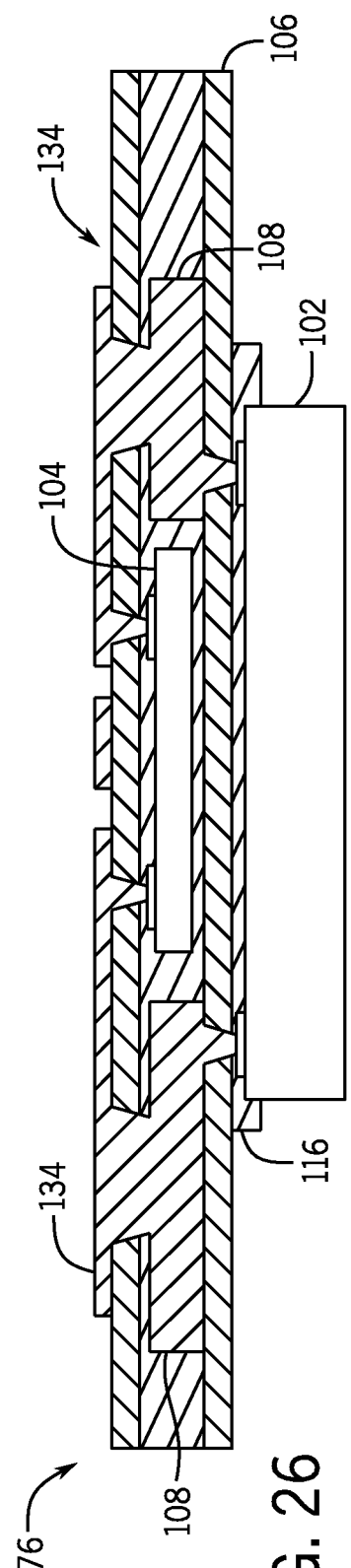

Referring to FIG. 24, a second insulating substrate 182 is coupled to the top surfaces 120, 180 of digital semiconductor device 104 and first conductor layer 108 with an insulating material 184. In one embodiment, insulating material 184 fills any voids between insulating substrate 106 and second insulating substrate 182. In an alternative embodiment, an electrically insulating material is used to fill any voids between substrates 106, 182 in a later step of the build-up process. Insulating material 184 is cured and a series of vias 186, 188 are formed through insulating substrate 182. As shown in FIG. 25, vias 186 are aligned with contact pads 122 of digital semiconductor device 104 and vias 188 are aligned with portions of first conductor layer 108. A second conductor layer 134 is then formed on a top surface 190 of insulating substrate 182 and extends through vias 186, 188 to electrically couple with digital semiconductor device 104 and first conductor layer 108. Optionally, a seed metal layer (e.g., layer 137 in FIG. 5A) may be applied to top surface 190 prior to formation of second conductor layer 134. Portions of second conductor layer 134 are then removed to define a high density L/S pattern using a masking and etching technique similar to that described above to yield the electronics package 176 with a multi-thickness conductor 134 as shown in FIG. 26.

In the embodiment illustrated in FIG. 24, second insulating substrate 182 is applied after positioning digital semiconductor device 104 on insulating substrate 106. In an alternative technique, digital semiconductor device 104 is attached to the second insulating substrate 182 prior to laminating second insulating substrate 182 atop first conductor layer 108. An additional polymer layer may be applied to fill any gaps therebetween using a known method such as film, ink, or spray deposition.

Similar to the embodiments illustrated in FIGS. 12 and 13, fabrication of either of electronics package 168 and electronics package 176 may also include the addition of an electrically insulating material and I/O connections. Where one or more of the embedded electrical components includes a backside contact pad, similar to contact pad 152 of FIG. 7, a conductive substrate may be included to provide an electrical connection thereto in a similar manner as illustrated in FIG. 13.

Beneficially, arranging semiconductor devices in a stacked arrangement in the manner described herein permits very short conductor runs between the semiconductor devices, thereby improving signal fidelity and reliability within the packaging structure and overall electrical performance of the package. Furthermore, incorporation of the multi-thickness conductor described herein enables locating disparate electrical components much closer in proximity to each other than prior art techniques such as that shown in FIG. 1, further enhancing the ability to reduce the length of conductor runs while providing the requisite high density routing capabilities and high current carrying capabilities for the different types of electrical components.

Therefore, according to one embodiment of the invention, an electronics package includes an insulating substrate, a first electrical component coupled to a bottom surface of the insulating substrate, and a first conductor layer formed adjacent the bottom surface of the insulating substrate. The electronics package also includes a second conductor layer formed on a top surface of the insulating substrate and extending through a plurality of vias in the insulating substrate to electrically couple with the first electrical component and the first conductor layer. A second electrical component is electrically coupled to the first conductor layer and the first electrical component and the second electrical component are positioned in a stacked arrangement.

According to another embodiment of the invention, a method of manufacturing an electronics package includes forming a first conductor layer on a bottom surface of an insulating substrate, coupling a first electrical component to the bottom surface of the insulating substrate adjacent the first conductor layer, and coupling a second electrical component to a bottom surface of the first conductor layer in a stacked arrangement with respect to the first electrical component. The method also includes forming a second conductor layer on a top surface of the insulating substrate, the second conductor layer extending through vias in the insulating substrate to electrically couple with the first electrical component and the first conductor layer.

According to yet another embodiment of the invention, an electronics package includes a pair of electrical components coupled to an insulating substrate, a first conductor layer formed on a first surface of the insulating substrate, and a second conductor layer formed on a second surface of the insulating substrate. A portion of the first conductor layer and one of the electrical components is positioned between the other electrical component and the insulating substrate.

One of the electrical components is positioned within an opening formed between adjacent portions of the first conductor layer.

According to yet another embodiment of the invention, an electronics package includes a first conductor layer, a first electrical component coupled to a bottom surface of a first insulating substrate and positioned between adjacent portions of the first conductor layer, and a second conductor layer coupled to a top surface of the first insulating substrate and extending through at least one via in the first insulating substrate to electrically couple with at least one contact pad of the first electrical component. The electronics packages also includes a second electrical component coupled to a bottom surface of a second insulating substrate. The first conductor layer extends through at least one via in the second insulating substrate to electrically couple with at least one contact pad of the second electrical component.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
   an insulating substrate;
   a first electrical component coupled to a bottom surface of the insulating substrate;
   a first conductor layer adjacent the bottom surface of the insulating substrate;
   a second conductor layer adjacent a top surface of the insulating substrate and extending through a plurality of vias in the insulating substrate to electrically couple with the first electrical component and the first conductor layer; and
   a second electrical component electrically coupled to the first conductor layer;
   wherein the first electrical component and the second electrical component are positioned in a stacked arrangement.

2. The electronics package of claim 1 wherein the first electrical component is positioned in an opening formed within the first conductor layer and wherein the first electrical component is adhered to the bottom surface of the insulating substrate.

3. The electronics package of claim 1 wherein the first conductor layer has a thickness greater than a thickness of the first electrical component.

4. The electronics package of claim 1 wherein the second conductor layer extends through a second plurality of vias in the insulating substrate to electrically couple with the second electrical component.

5. The electronics package of claim 1 wherein the first electrical component comprises a digital semiconductor device; and
   wherein the second electrical component comprises a power semiconductor device.

6. The electronics package of claim 1 wherein a surface of the first electrical component comprising contact pads and a surface of the second electrical component comprising contact pads face a common direction.

7. The electronics package of claim 1 further comprising a conductive joining material coupling the second electrical component to the first conductor layer.

8. The electronics package of claim 1 further comprising a second insulating substrate positioned between the first electrical component and the second electrical component; and
   wherein the first conductor layer extends through vias formed in the second insulating substrate to electrically couple with the second electrical component.

9. The electronics package of claim 1 wherein the bottom surface of the insulating substrate has an adhesion layer and a seed layer applied thereto.

10. The electronics package of claim 1 wherein the top surface of the insulating substrate has an adhesion layer and a seed layer applied thereto.

11. A method of manufacturing an electronics package comprising:
    forming a first conductor layer on a bottom surface of an insulating substrate;
    coupling a first electrical component to the bottom surface of the insulating substrate adjacent the first conductor layer;
    coupling a second electrical component to a bottom surface of the first conductor layer in a stacked arrangement with respect to the first electrical component; and
    forming a second conductor layer on a top surface of the insulating substrate, the second conductor layer extending through vias in the insulating substrate to electrically couple with the first electrical component and the first conductor layer.

12. The method of claim 11 further comprising positioning the first electrical component within an opening formed between adjacent portions of the first conductor layer, with the first electrical component being adhered to the bottom surface of the insulating substrate via an electrically insulating material.

13. The method of claim 11 further comprising forming the first conductor layer with a thickness greater than a thickness of the second conductor layer.

14. The method of claim 11 further comprising coupling the second electrical component to the bottom surface of the first conductor layer with one of an insulating material and a conductive joining material.

15. The method of claim 11 further comprising:
    forming the first conductor layer having a high density routing pattern; and
    forming the second conductor layer having a low density routing pattern.

16. The method of claim 11 wherein coupling the first electrical component to the insulating substrate comprises coupling a digital semiconductor device to the insulating substrate; and
    wherein coupling the second electrical component to the insulating substrate comprises coupling a power semiconductor device to the insulating substrate.

17. The method of claim 11 further comprising applying an adhesion layer and a seed layer to the bottom surface of the insulating substrate prior to forming the first conductor layer.

18. The method of claim 17 further comprising applying an adhesion layer and a seed layer to the top surface of the insulating substrate prior to forming the second conductor layer.

19. An electronics package comprising:
a pair of electrical components coupled to an insulating substrate;
a first conductor layer proximate a first surface of the insulating substrate; and
a second conductor layer proximate a second surface of the insulating substrate;
wherein a portion of the first conductor layer and one of the electrical components is positioned between the other electrical component and the insulating substrate; and
wherein one of the electrical components is positioned within an opening between adjacent portions of the first conductor layer.

20. The electronics package of claim 19 wherein the first conductor layer is thicker than the second conductor layer.

21. The electronics package of claim 19 wherein the pair of electrical components are aligned along a common vertical axis.

22. The electronics package of claim 19 wherein the second conductor layer comprises a line/space (L/S) pattern having a routing density greater than a routing density of a L/S pattern of the first conductor layer.

23. The electronics package of claim 19 wherein the pair of electrical components comprises a digital semiconductor device and a power semiconductor device.

24. The electronics package of claim 23 wherein the digital semiconductor device is positioned between the power semiconductor device and the insulating substrate.

25. The electronics package of claim 19 further comprising an insulating material encapsulating at least one of the electrical components.

26. The electronics package of claim 19 further comprising a conductive substrate coupled to a backside contact pad of the other electrical component.

27. The electronics package of claim 19 wherein one of the electrical components is directly adhered to the insulating substrate and the other electrical component is coupled to the insulating substrate through the first conductor layer.

28. The electronics package of claim 19 wherein a surface of the first conductor layer distal from the insulating substrate is a planar surface.

29. An electronics package comprising:
a first conductor layer;
a first electrical component coupled to a bottom surface of a first insulating substrate and positioned between adjacent portions of the first conductor layer;
a second conductor layer coupled to a top surface of the first insulating substrate and extending through at least one via in the first insulating substrate to electrically couple with at least one contact pad of the first electrical component; and
a second electrical component coupled to a bottom surface of a second insulating substrate;
wherein the first conductor layer extends through at least one via in the second insulating substrate to electrically couple with at least one contact pad of the second electrical component.

30. The electronics package of claim 29 wherein the first electrical component is positioned within an opening formed between adjacent portions of the first conductor layer, with the first electrical component being adhered to the bottom surface of the first insulating substrate via an electrically insulating material.

31. The electronics package of claim 29 wherein the second insulating substrate is positioned between the first electrical component and the second electrical component.

32. The electronics package of claim 29 wherein the first conductor layer has a thickness greater than a thickness of the second conductor layer.

* * * * *